(12) United States Patent
Fan et al.

(10) Patent No.: US 11,881,771 B2
(45) Date of Patent: Jan. 23, 2024

(54) HALF-BRIDGE POWER CIRCUIT, CONTROLLER THEREFOR, AND METHOD FOR CONTROLLING THE SAME

(71) Applicant: NXP USA, Inc., Austin, TX (US)

(72) Inventors: Bo Fan, Tianjin (CN); Meng Wang, Tanggu (CN); Pengcheng Lin, Tianjin (CN)

(73) Assignee: NXP USA, INC., Austin, TX (US)

( * ) Notice: Subject to any disclaimer, the term of this patent is extended or adjusted under 35 U.S.C. 154(b) by 83 days.

(21) Appl. No.: 17/649,655

(22) Filed: Feb. 1, 2022

(65) Prior Publication Data

US 2022/0255424 A1 Aug. 11, 2022

(30) Foreign Application Priority Data

Feb. 9, 2021 (CN) .......................... 202110176570.6

(51) Int. Cl.
| | |
|---|---|
| H02M 3/156 | (2006.01) |
| H02M 3/158 | (2006.01) |
| H02M 3/155 | (2006.01) |
| G05F 1/613 | (2006.01) |
| H02M 1/08 | (2006.01) |
| H02M 7/219 | (2006.01) |

(52) U.S. Cl.
CPC ............ *H02M 3/155* (2013.01); *G05F 1/613* (2013.01); *H02M 1/08* (2013.01); *H02M 7/219* (2013.01); *H02M 3/156* (2013.01); *H02M 3/158* (2013.01); *H02M 3/1588* (2013.01)

(58) Field of Classification Search
CPC ..... H02M 3/156; H02M 3/158; H02M 3/1588
See application file for complete search history.

(56) References Cited

U.S. PATENT DOCUMENTS

| | | | | |
|---|---|---|---|---|
| 5,568,044 | A | * 10/1996 | Bittner | ................ H02M 3/1588 323/224 |
| 5,747,972 | A | 5/1998 | Baretich et al. | |
| 5,986,895 | A | 11/1999 | Stewart et al. | |
| 6,307,356 | B1 | 10/2001 | Dwelley | |
| 6,396,250 | B1 | * 5/2002 | Bridge | ................. H03K 17/165 323/283 |
| 6,861,826 | B2 | 3/2005 | Lynch | |

(Continued)

FOREIGN PATENT DOCUMENTS

WO 2020123144 A1 6/2020

*Primary Examiner* — Gary A Nash

(57) ABSTRACT

A controller for a half-bridge power circuit includes a measurement circuit, a controller circuit, a high-side delay circuit, and a low-side delay circuit. The measurement circuit connects to the half-bridge node, measures the half-bridge voltage, and generates a multi-bit status signal indicative of the measured half-bridge voltage. The controller circuit connects to the measurement circuit, and receives the status signal therefrom. The controller circuit generates at least a delay control signal based on the status signal. The high-side delay circuit connects to the controller circuit to receive the delay control signal. The high-side delay circuit provides a high-side control signal in response to the delay control signal, to switch on/off the high-side switch. The low-side delay circuit connects to the controller circuit to receive the delay control signal. The low-side delay circuit provides a low-side control signal in response to the delay control signal, to switch on/off the low-side switch.

20 Claims, 10 Drawing Sheets

(56) References Cited

U.S. PATENT DOCUMENTS

| | | |
|---|---|---|
| 7,031,175 B2 | 4/2006 | Dequina et al. |
| 7,436,160 B2 | 10/2008 | Rusu et al. |
| 7,446,513 B2 | 11/2008 | Dikken et al. |
| 7,683,594 B2 * | 3/2010 | Kim ........................ H02M 1/38 |
| | | 323/282 |
| 2003/0201760 A1 * | 10/2003 | Umemoto ............. H02M 3/156 |
| | | 323/271 |
| 2005/0099226 A1 | 5/2005 | Risbo et al. |
| 2008/0265975 A1 | 10/2008 | Takasu et al. |
| 2009/0322407 A1 * | 12/2009 | Lenz ....................... H02M 1/38 |
| | | 327/419 |
| 2016/0072501 A1 | 3/2016 | Masaoka |
| 2018/0054118 A1 * | 2/2018 | Lee ........................ H02M 3/157 |

* cited by examiner

HALF-BRIDGE POWER CIRCUIT, CONTROLLER THEREFOR, AND METHOD FOR CONTROLLING THE SAME

BACKGROUND

The present disclosure relates to a half-bridge power circuit, a controller therefor, and a method for controlling the half-bridge power circuit, and more particularly relates to a half-bridge power circuit with controlled dead-time, and a method for controlling a dead-time of the half-bridge power circuit.

Half-bridge power circuits generate square wave signals by alternately closing a high-side switch (HS) and a low-side switch (LS). FIG. 1 illustrates a half-bridge power circuit 100 and control signals applied to its switches. The half-bridge power circuit 100 includes a high-side switch (HS) 102 and a low-side switch (LS) 104. The HS 102 and the LS 104 are series connected between a power supply and ground, and alternately close to provide an output signal $V_1$ from the input voltage $V_2$. Signal 106 is applied to the HS 102, and signal 108 is applied to the LS 104, to control the switches between ON/OFF states.

As shown in FIG. 1, the HS 102 and the LS 104 are not closed simultaneously, to avoid the power supply from being short connected to ground—a condition generally referred to as "shoot-through". More particularly, there is an interval between an ON state of the signal 106 and a subsequent ON state of the signal 108. As a result, conductions of the HS 102 and the LS 104 are subject to a delay period, to ensure the HS 102 and the LS 104 are not conductive at a same time. It is desirable to control the interval, also referred to as a dead-time, as short as possible, to minimize power loss. In addition, the dead-time must be sufficient to allow for PVT (process, voltage, temperature) variations and still prevent shoot-through.

SUMMARY

This summary is provided to introduce a selection of concepts in a simplified form that are further described below in the Detailed Description. This summary is not intended to identify key or essential features of the claimed subject matter, nor is it intended to be used to limit the scope of the claimed subject matter.

In one embodiment, there is provided a controller for a half-bridge power circuit. The half-bridge power circuit includes a high-side switch and a low-side switch. The high-side switch and the low-side switch are series connected between a power supply and ground. A half-bridge node between the high-side switch and the low-side switch provides a half-bridge voltage. The controller includes a measurement circuit, a controller circuit, a high-side delay circuit, and a low-side delay circuit. The measurement circuit is configured to be connected to the half-bridge node, and to measure the half-bridge voltage, and generate a multi-bit status signal indicative of the measured half-bridge voltage. The controller circuit is connected to the measurement circuit, and is configured to receive the status signal therefrom. The controller circuit is configured to generate at least a delay control signal based on the status signal. The high-side delay circuit is connected to the controller circuit to receive the delay control signal. The high-side delay circuit is configured to provide a high-side control signal in response to the delay control signal, to switch on/off the high-side switch. The low-side delay circuit is connected to the controller circuit to receive the delay control signal. The low-side delay circuit is configured to provide a low-side control signal in response to the delay control signal, to switch on/off the low-side switch.

In another embodiment, there is provided a method of operating a half-bridge power circuit. The half-bridge power circuit includes a high-side switch connected between a power supply and a half-bridge node, and a low-side switch connected between the high-side switch and ground. The method includes: a measurement circuit connected to the half-bridge node and measuring a half-bridge voltage at the half-bridge node, and generating a multi-bit status signal indicative of the measured half-bridge voltage; a controller circuit connected to the measurement circuit and generating at least a delay control signal based on the status signal; a high-side delay circuit connected to the controller circuit and generating a high-side control signal using the delay control signal, wherein the high-side switch is switched on/off depending on the high-side control signal; a low-side delay circuit connected to the controller circuit and generating a low-side control signal using the delay control signal, wherein the low-side switch is switched on/off depending on the low-side control signal; and the half-bridge node providing the half-bridge voltage of the half-bridge power circuit.

BRIEF DESCRIPTION OF THE DRAWINGS

So that the manner in which the above recited features of the present disclosure can be understood in detail, a more detailed description of the disclosure may be had by reference to embodiments, some of which are illustrated in the appended drawings. The appended drawings illustrate only typical embodiments of the disclosure and should not limit the scope of the disclosure, as the disclosure may have other equally effective embodiments. The drawings are for facilitating an understanding of the disclosure and thus are not necessarily drawn to scale. Advantages of the subject matter claimed will become apparent to those skilled in the art upon reading this description in conjunction with the accompanying drawings, in which like reference numerals have been used to designate like elements, and in which:

DETAILED DESCRIPTION

Figure 2:
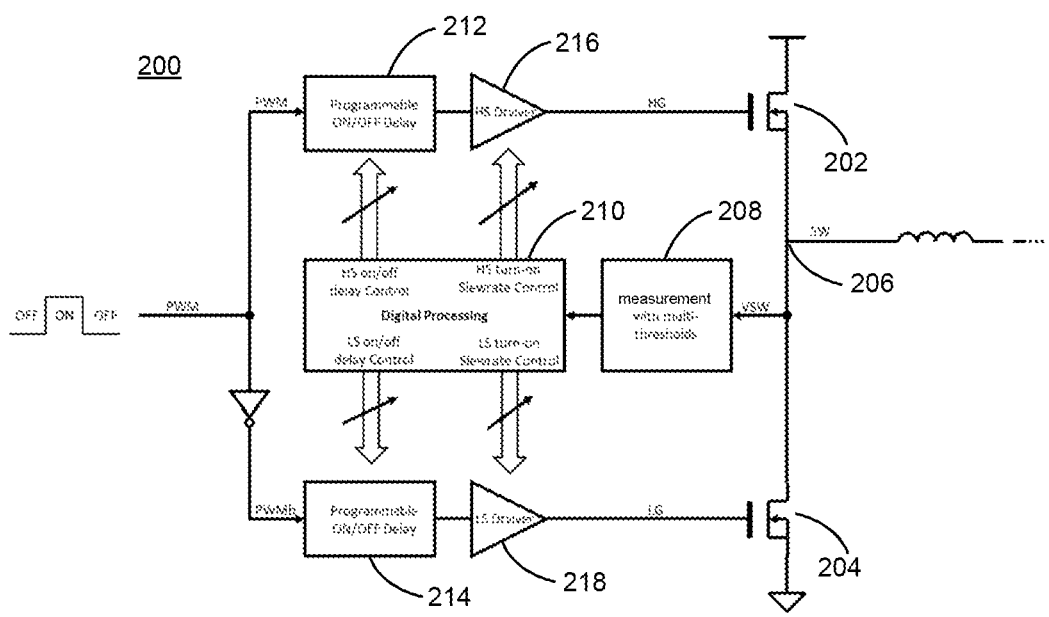
FIG. 2 is a block diagram of system including a half-bridge power circuit and a controller according to an embodiment.

FIG. 2 is a block diagram of system 200 including a half-bridge power circuit and a controller in accordance with one or more embodiments. The half-bridge power circuit includes a high-side switch (HS) 202 and a low-side switch (LS) 204 that are connected in series, between a power supply and ground. A half-bridge node 206 between the HS 202 and the LS 204 provides a half-bridge voltage SW, which typically is a square wave.

The system 200 of FIG. 2 further includes a controller which includes a measurement circuit 208 used for being connected to the half-bridge node 206, a controller circuit 210, a high-side delay circuit 212, a low-side delay circuit 214, a high-side driver circuit 216, and a low-side driver circuit 218. The measurement circuit 208 measures the half-bridge voltage VSW. As a response, the measurement circuit 208 generates a multi-bit status signal indicative of the measured half-bridge voltage VSW.

The measurement circuit 208 provides the generated status signal to the controller circuit 210 of the controller. The controller circuit 210 is connected to the measurement circuit 208 to receive the status signal, and generates at least a delay control signal based on the status signal. The controller circuit 210 provides the generated delay control signal to the high-side delay circuit 212 and the low-side delay circuit 214 that are both connected to the controller circuit 210. As shown in FIG. 2, the controller circuit 210 can be implemented as a digital processing circuit which is able to process the digitalized multi-bit status signal. In the embodiment depicted in FIG. 2, the high-side delay circuit 212 and the low-side delay circuit 214 are programmable ON/OFF delay circuits that receive switch signals PWM, and introduce delays into the switch signals, which delays are programmable according to the delay control signals received from the controller circuit 210. In response, the high-side delay circuit 212 generates a high-side control signal, and the low-side delay circuit 214 generate a low-side control signal.

The high-side driver circuit 216 connected to the high-side delay circuit 212 receives the high-side control signal, and the low-side driver circuit 218 connected to the low-side delay circuit 214 receives the low-side control signal. The high-side driver circuit 216 is further connected to the high-side switch 202, to provide a high-side driver signal generated in response to the high-side control signal. The high-side driver signal from the high-side driver circuit 216 switches on/off the high-side switch 202. Similarly, the low-side driver circuit 218 is further connected to the low-side switch 204, to provide a low-side driver signal generated in response to the low-side control signal. The low-side driver signal from the low-side driver circuit 218 switches on/off the low-side switch 204.

As illustrated in FIG. 2, according to the present embodiment, the controller circuit 210 further generates a high-side slew-rate control signal in response to the status signal from the measurement circuit 208, and provides the high-side slew-rate control signal to the high-side driver circuit 216. The high-side driver circuit 216 is connected to the controller circuit 210 to receive the high-side slew-rate control signal, and accordingly generates the high-side driver signal based on the high-side control signal and the high-side slew-rate control signal. Also shown in FIG. 2, the controller circuit 210 generates a low-side slew-rate control signal in response to the status signal from the measurement circuit 208, and provides the low-side slew-rate control signal to the low-side driver circuit 218. The low-side driver circuit 218 is connected to the controller circuit 210 to receive the low-side slew-rate control signal, and accordingly generates the low-side driver signal based on the low-side control signal and the low-side slew-rate control signal.

Figure 3:
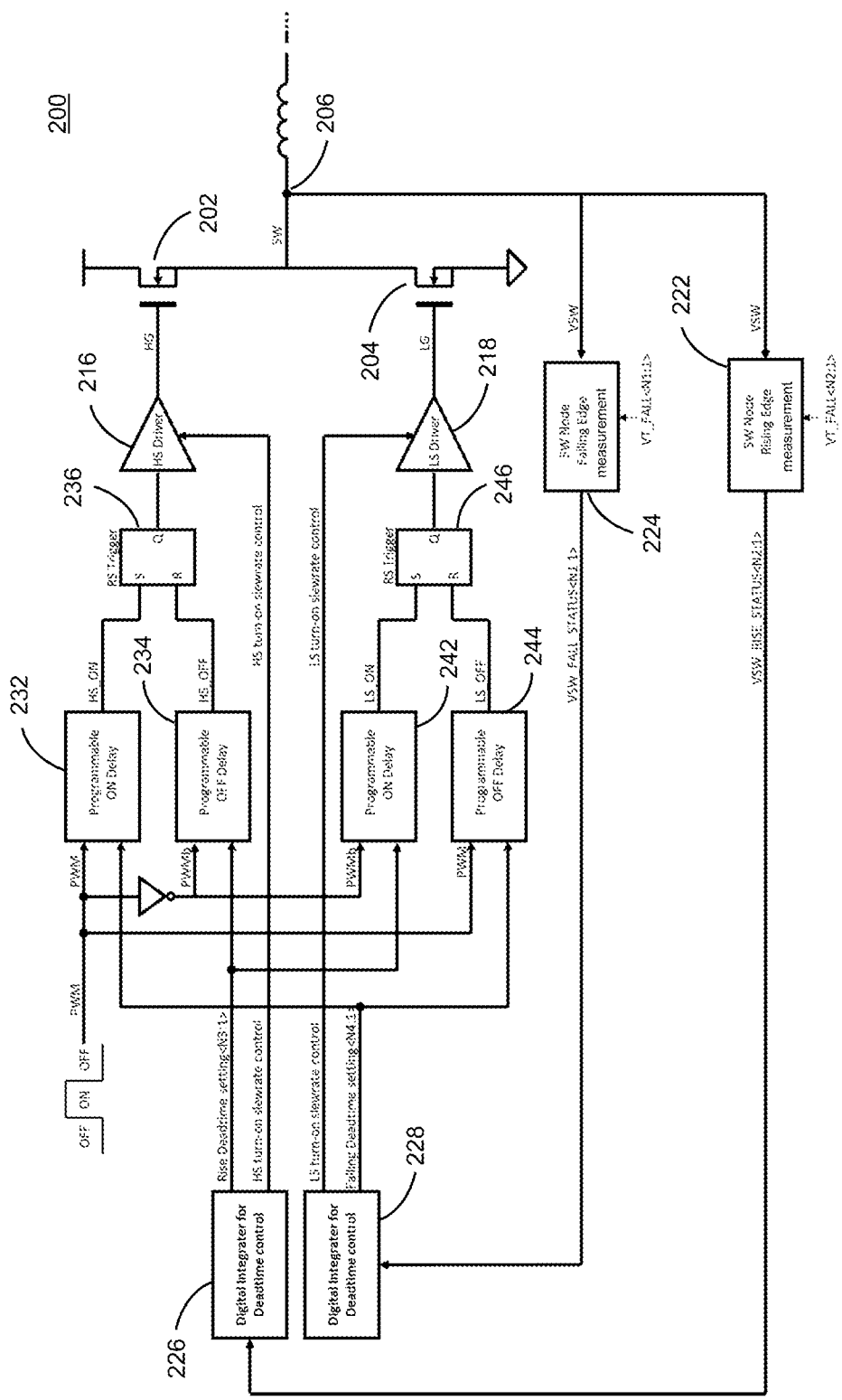
FIG. 3 is a schematic diagram of the half-bridge power circuit and the controller of FIG. 2.

FIG. 3 is a more detailed diagram of the system 200 of FIG. 2. In the controller of the system 200, the measurement circuit 208 includes a first measurement circuit 222 and a second measurement circuit 224 that are both connected to the half-bridge node 206 to receive the half-bridge voltage SW. Respectively, the first measurement circuit 222 measures the half-bridge voltage VSW having a rising edge therein, and the second measurement circuit 224 measures a falling edge in the half-bridge voltage SW. The first measurement circuit 222 and the second measurement circuit 224 respectively generates status signals indicative of the measured rising/falling edges.

As depicted in FIG. 3, the controller circuit 210 includes a first controller 226 and a second controller 228. Generally, the first controller 226 is connected to the first measurement circuit 222 to receive the status signal, and is used for generating a rise deadtime setting signal in response to the status signal from the first measurement circuit 222 indicating a rising edge in the half-bridge voltage SW being measured, to control the high-side switch 202. The second controller 228 is connected to the second measurement circuit 224 to receive the status signal, and is used for generating a falling deadtime setting signal in response to the status signal from the second measurement circuit 224 indicating a falling edge in the half-bridge voltage SW being measured, to control the low-side switch 204. As shown in FIG. 2, the first controller 226 and the second controller 228 can be implemented as digital integrators.

The high-side delay circuit 212 includes a high-side ON delay circuit 232, a high-side OFF delay circuit 234, and a high-side trigger circuit 236. The high-side ON delay circuit 232 receives the falling deadtime setting signal from the second controller 228, and a PWM signal, and generates a high-side ON signal HS_ON as a response. The high-side ON delay circuit 232 provides the high-side ON signal HS_ON to the high-side trigger circuit 236. The high-side OFF circuit 234 receives the rise deadtime setting signal from the first controller 226, and an inverted version PWMb of the PWM signal, and generates a high-side OFF signal HS_OFF as a response. The high-side OFF circuit provides the high-side OFF signal HS_OFF to the high-side trigger circuit 236. The high-side trigger circuit 236 has a first input terminal S connected to the high-side ON delay circuit 232 to receive the high-side ON signal HS_ON, and a second input terminal R connected to the high-side OFF delay circuit 234 to receive the high-side OFF signal HS_OFF. The high-side trigger circuit 236 generates the high-side control signal as a response, and provides the high-side control signal to the high-side driver circuit 216.

As also depicted in FIG. 3, the low-side delay circuit 214 includes a low-side ON delay circuit 242, a low-side OFF delay circuit 244, and a low-side trigger circuit 246. The low-side ON delay circuit 242 receives the rise deadtime setting signal from the first controller 226, and an inverted version PWMb of the PWM signal, and generates a low-side ON signal LS_ON as a response. The low-side ON delay circuit 242 provides the low-side ON signal LS_ON to the low-side trigger circuit 246. The low-side OFF delay circuit 244 receives the falling deadtime setting signal from the second controller 228, and the PWM signal, and generates a low-side OFF signal LS_OFF as a response. The low-side OFF delay circuit 244 provides the low-side OFF signal LS_OFF to the low-side trigger circuit 246. The low-side trigger circuit 246 has a first input terminal S connected to the low-side ON delay circuit 242 to receive the low-side ON signal LS_ON, and a second input terminal R connected to the low-side OFF delay circuit 244 to receive the low-side OFF signal LS_OFF. The low-side trigger circuit 246 generates the low-side control signal as a response, and provides the low-side control signal to the low-side driver circuit 218.

Figure 4:
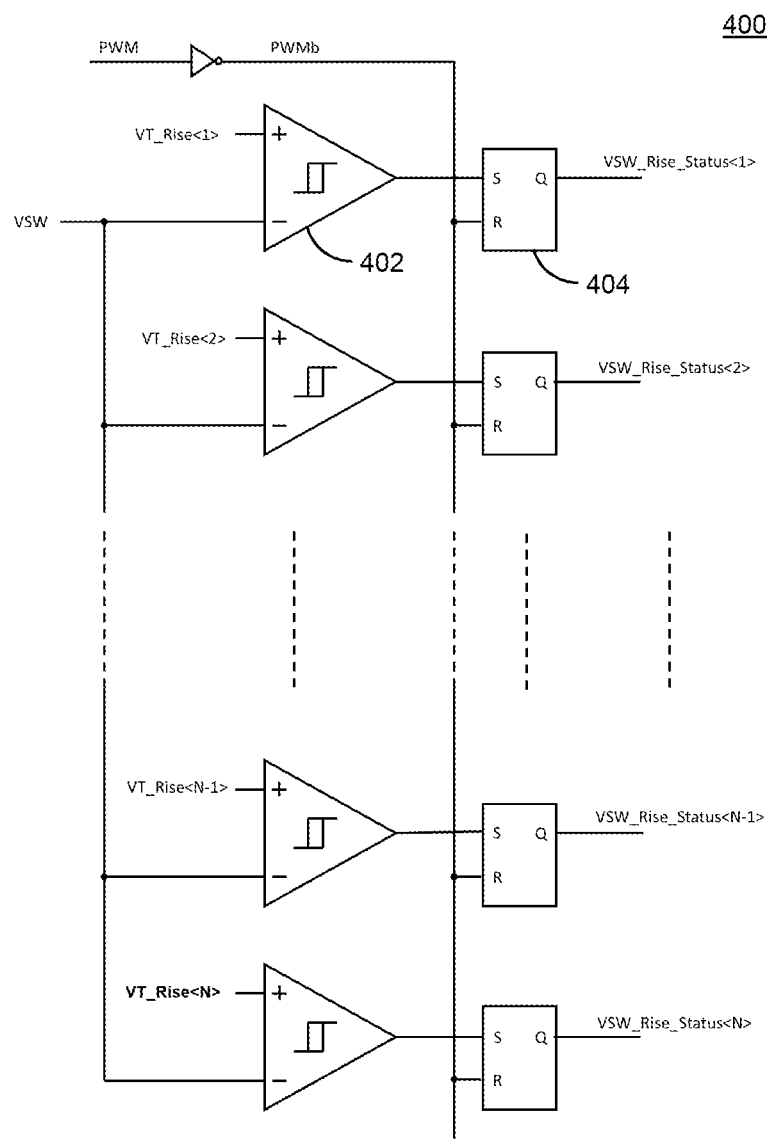
FIG. 4 is a schematic diagram of the measurement circuit according to an embodiment.

FIG. 4 illustrates a schematic diagram of a measurement circuit for measuring a rising edge in the half-bridge voltage SW according to an embodiment. The measurement circuit 400 can be an implementation of the first measurement circuit 222 of FIG. 3. The measurement circuit 400 receives the half-bridge voltage SW from the half-bridge node 206, and measures its voltage VSW. In the depicted embodiment, the measurement circuit 400 compares the voltage VSW to multiple (N) reference voltages VT_Rise<1> to VT_Rise<N>, to determine whether the voltage VSW is higher than the each respective reference voltage. In detail, the measurement circuit 400 includes N comparators 402 each of which receives the half-bridge voltage SW and a respective reference voltage. Each comparator 402 compares the voltage VSW of the half-bridge voltage SW with the respective reference voltage, and each generates a comparator output signal indicative of its comparison.

The measurement circuit 400 further includes multiple (N) trigger circuits 404 each of which corresponds to a comparator 402, and each of which may be implemented, as shown, as a Set-Reset latch. Each trigger circuit 404 receives the comparator output signal from the corresponding comparator 402 at an S, or "set", terminal thereof, and an inverted version PWMb of the PWM signal at an R or "reset" terminal thereof. Each trigger circuit 404 generates one of the N bits in the status signal. During one cycle of the PWM signal, provided that the half-bridge voltage VSW is not higher than the corresponding reference voltage, "S" is high, and the trigger circuit 404 will generates a bit "1" accordingly. On the other hand, if the voltage VSW of the half-bridge voltage SW is higher than the corresponding reference voltage, "S" is low, and the respective trigger circuit 404 accordingly keeps the default bit "0" as its output. The status signal is reset as multiple bits of "0" at a start of a next cycle of the PWM signal, which corresponds to the moment that "PWM" goes low (such that PWMb goes high, sending "R" high to reset the latch).

It is understood that an implementation of the measurement circuit 224 measuring falling edges in the half-bridge voltage SW has a similar configuration to the measurement circuit 400 of FIG. 4. However, for measuring falling edges in the half-bridge voltage SW, the comparators receive the half-bridge voltage SW at inverting input terminals thereof, and the reference voltages at non-inverting input terminals. Besides, for the measurement of falling edges in the half-bridge voltage SW, the trigger circuits receive the PWM signal at the R terminals.

Figure 5:
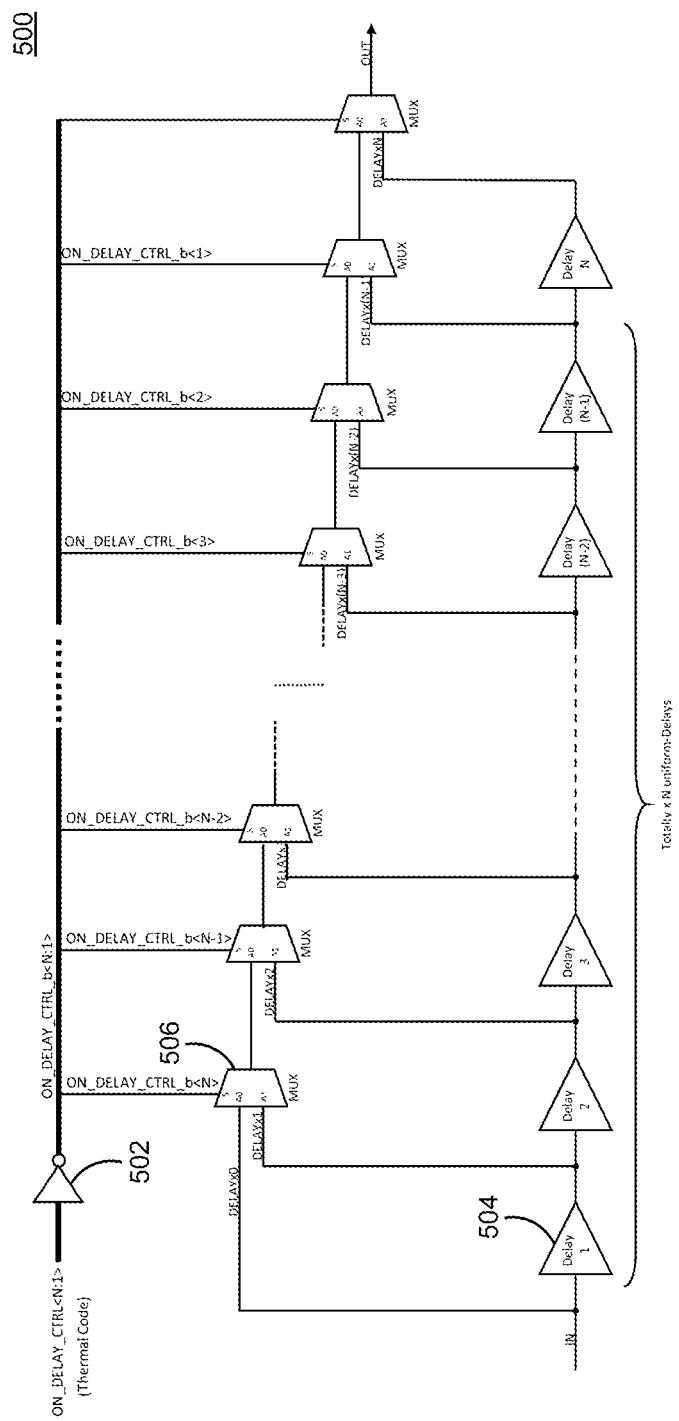
FIG. 5 is a schematic diagram of the delay circuit according to an embodiment.

FIG. 5 is a schematic diagram of a delay circuit 500 according to an embodiment. The delay circuit 500 may be an example implementation of the high-side delay circuit 212 of FIG. 2, or the high-side ON delay circuit 232 of FIG. 3. The delay circuit 500 receives the delay control signal from the controller circuit 210, and uses each bit of the delay control signal to determine whether to apply a corresponding delay to a received input signal IN. In detail, the delay circuit 500 includes an inverter 502 which receives a thermometer encoded delay control signal ON_DELAY_CTRL, and inverts every bit in the delay control signal to be an inverted delay control signal ON_DELAY_CTRL_b. A thermometer encoded signal refers to a signal of which the value is equal to the quantity of bits "1" in the signal. For example, a value of a thermometer encoded signal "001111" is 4, and a value of signal "0000111" is 3. The delay circuit 500 further includes multiple delay units 504 and correspondingly multiple MUX circuits 506. The multiple delay units 504 are series connected, each applying a predetermined delay to the input signal IN as delayed by the previous stage of the delay units 504. Input and output of each delay unit 504 are provided to a corresponding MUX circuit 506 which receives a corresponding bit of the inverted delay control signal ON_DELAY_CTRL_b, and uses the received bit to determine whether the predetermined delay introduced by the corresponding delay unit 504 is applied into the input signal IN.

As an example, a thermometer encoded delay control signal ON_DELAY_CTRL "000011" will be converted by the inverter 502 into the inverted delay control signal ON_DELAY_CTRL_b as "111100". In turn, because there are 4 bits of "1" in the inverted delay control signal ON_DELAY_CTRL_b, 4 times the predetermined delay will be applied into the input signal IN to be the final output signal OUT of the delay circuit 500. An embodiment of the high-side OFF delay circuit 234 and the low-side OFF delay circuit 244 has a similar configuration as the delay circuit 500 of FIG. 5, but without an inverter to invert the thermometer encoded delay control signal OFF_DELAY_CTRL.

Figure 1:
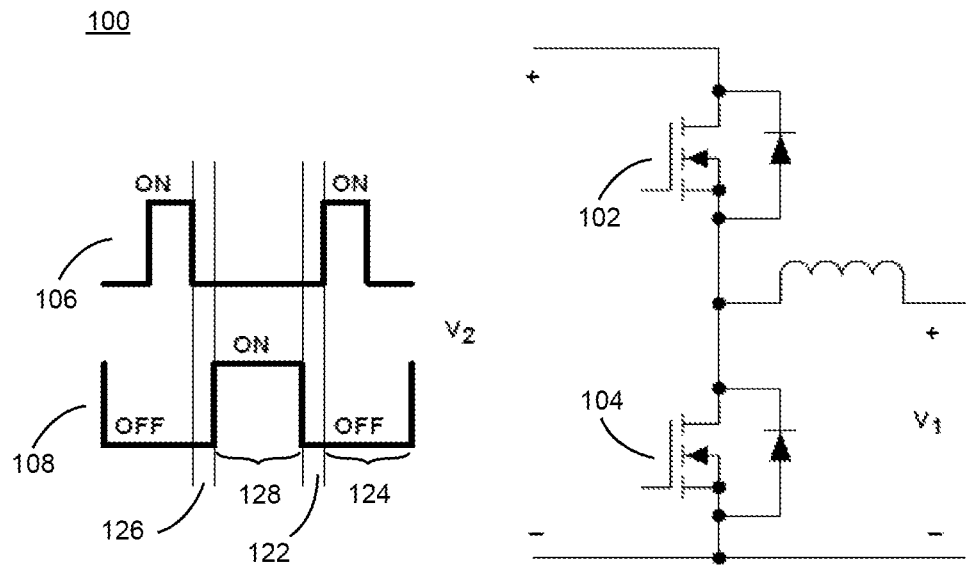
FIG. 1 is a half-bridge power circuit and control signals applied to its switches.

Referring now back to FIG. 1, generally, the half-bridge power circuit 100 operates in a first period 122 during which the HS 102 and the LS 104 are both in an off state, a second period 124 during when the HS 102 is on while the LS 104 remains off, a third period 126 during which the HS 102 is off while the LS 104 remains off, and a fourth period 128 during which the HS 102 remains off and the LS 104 is on. The half-bridge power circuit 100 operates in the four periods repeatedly, and accordingly the first period 122 and the third period 126 when both the HS 102 and the LS 104 are both off are referred to as "dead-time". It is understood that during the first period 122 the HS 102 is delayed from being "on" until the start of the second period 124, and during the third period 126 the LS 104 is delayed from being "on" until the start of the fourth period 128. On the other hand, during the third period 126 when the HS 102 is off, and during the first period 122 when the LS 104 is off, it is desirable to delay the HS 102 or the LS 104 from being off, due to the reverse recovery current at the body diodes of MOSFETs, which will be explained in more details below.

Figure 6:
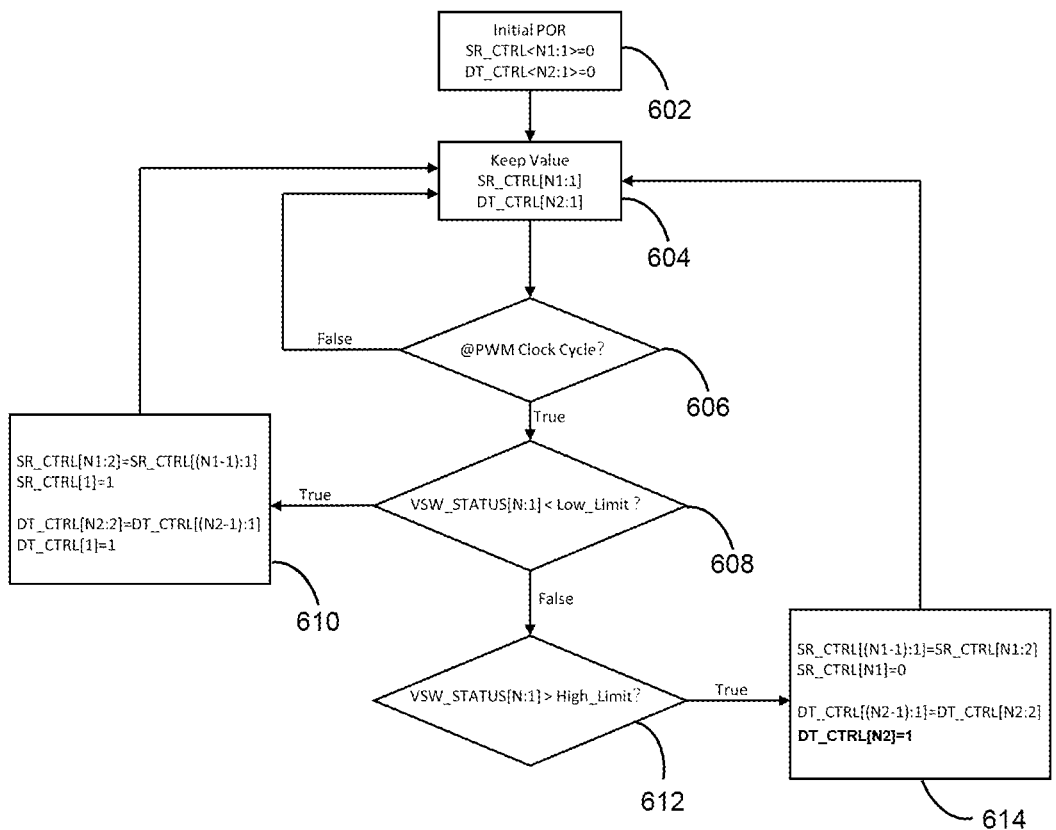
FIG. 6 is a flow diagram of a method of the controller generating delay time control signals and slew rate control signals according to an embodiment.

FIG. 6 shows a flow diagram of an embodiment of a method for generating a delay control signal by, for example, the first controller 226 of FIG. 3. The method is described herein with reference to the first measurement circuit 222 measuring a rising edge in the half-bridge voltage VSW, and with reference to FIG. 7 which depicts signals in the system 200 of FIG. 3. The method starts from a period 702, which can be during the fourth period as described above when the HS 202 and the LS 204 are both "off" in response to the low-level control signal LG and HG applied on control terminals thereof. Seeing from FIG. 7, during the fourth period 702 when the low-side switch control signal LG goes low trying to turn off the LS 204, there occurs a reverse recovery current in the LS 204, resulting in a negative voltage drop across the LS 204. As depicted by reference 704 in FIG. 7, the half-bridge voltage VSW on the half-bridge node 206 becomes lower than the ground level.

The negative voltage drop during the fourth period 702 is a result of the body diode conduction in the LS 204. In a subsequent first period 706 when the HS 202 starts to conduct in response to the control signal HG applied on its control terminal rising, the voltage VSW of the half-bridge voltage SW starts increasing from the negative voltage level at which the body diode in the switch is in conduction, which is a waste of efficiency, also referred to as "reverse recovery loss". The measurement circuit 222 measures the half-bridge voltage VSW, and accordingly adjusts the time period 702 before the control signal HG applying to the HS 202 becomes high. The adjusted time period 702 becomes optimal to avoid the half-bridge voltage VSW from being increased from a very low negative voltage, and the overall efficiency of the half-bridge power circuit can be improved. In the current embodiment, the negative voltage level of the half-bridge voltage VSW is typically −0.7V, and it is desirable that the half-bridge voltage VSW does not drop to as low as −0.7V. Instead, an optimal voltage range of −0.5V to −0.3V is required.

In detail, the measurement circuit 222 uses the comparators, for example the comparators 402 of FIG. 4, to compare the voltage VSW of the half-bridge voltage SW to the multiple reference voltages, and generates a status signal VSW_Rise_Status including multiple bits. The multiple reference voltages VT_Rise<1> to VT_Rise<N> are configured as voltages within the range between 0V and the negative voltage level, for example −0.7V, with intervals configured according to granularity requirements. In various embodiments, the measurement circuit 400 of FIG. 4 includes 2 to 8 comparators each configured to contribute a bit in the status signal. The bits in the status signal VSW_Rise_Status, e.g. a value of the status signal VSW_Rise_Status indicates whether the half-bridge voltage VSW is higher or lower than the corresponding reference voltage. For example, referring to FIG. 4, if the measurement circuit 400 includes 7 comparators each receiving a corresponding reference voltage of 0V, −0.1V, −0.2V, . . . , −0.7V at non-inverting input terminals thereof, the half-bridge voltage SW having a voltage VSW of −0.55V will result in a status signal VSW_Rise_Status of "0011111", representing that the half-bridge voltage VSW is higher than −0.6V, and lower than −0.5V. As another example, the half-bridge voltage VSW of −0.25V results in the status signal VSW_Rise_Status as "0000111".

Returning to FIG. 6, at step 602, the controller circuit performs a power on reset (POR) to initiate the delay control signal DT_CTRL as "0". At step 604, the initial delay control signal is kept, and is prepared for potentially subsequent changes. It is determined at step 606 if the current procedure is still within a current PWM clock cycle. The delay control signal will be kept as before if the PWM clock cycle has passed. Otherwise, if the current PWM clock cycle does not expire, the method goes to step 608. At step 608, the controller circuit compares a value of the status signal VSW_STATUS with a lower limit voltage value. Take the above mentioned example, if it is desired that the half-bridge voltage SW will be hereinafter pulled up from a lower limit of −0.5V instead of a normal lowermost voltage −0.7V, the status signal VSW_Rise_Status "0011111" indicating the half-bridge voltage VSW being −0.55V will be determined in this step 608 as lower than the lower limit voltage −0.5V, and the method goes to step 610.

At step 610, the delay control signal DT_CTRL is modified to allow the HS 202 to be "on" earlier in a next cycle. As depicted in FIG. 5, the number of "0" bits in the delay control signal ON_DELAY_CTRL determines the delay time to be introduced into the control signal applied on the control terminal of the HS 202. Accordingly, in the current embodiment, step 610 can be implemented as to reduce the number of "0" bits in the delay control signal DT_CTRL. In detail, the current delay control signal DT_CTRL is shifted one bit left, and a rightmost bit of the delay control signal is set as "1". By adding a "1" bit into the right side of the delay control signal, the number of "0" bits in the delay control signal is reduced, and accordingly the delay time to be introduced into the control signal for the HS 202 is also reduced. The method then goes to step 604 to keep the shifted delay control signal and prepare for a next potential shift through the steps 606 and 608.

On the other hand, if step 608 determines the status signal to indicate that the half-bridge voltage VSW is not lower than the lower limit voltage, the method goes to step 612 where the controller circuit 210 compares the value of the status signal VSW_STATUS with a higher limit voltage value. Similar to the example as described above, if it is desired that the half-bridge voltage SW shall be pulled up when the LS 204 is reasonably recovered from the body conduction and the half-bridge voltage SW is within a reasonably range no higher than −0.3V, the status signal VSW_Rise_Status "0000011" indicating the half-bridge voltage VSW of −0.25V will be determined in this step 612 as higher than the higher limit voltage −0.3V, and the method goes to step 614.

Similar as what is operated in step 610, the step 614 modifies the delay control signal DT_CTRL to allow the HS 202 to be "on" later in a next cycle. As depicted in FIG. 5, the more "0" bits in the delay control signal ON_DELAY_CTRL, the more delay time is introduced into the control signal applied on the control terminal of the HS 202, the step 614 accordingly shifts the current delay control signal one bit right, and a leftmost bit of the delay control signal is set as "0". By such, the delay control signal is added a "0" bit, and subsequently by the delay circuit 500 to introduce more delay time into the control signal for the HS 202. The method then goes to step 604 to keep the shifted delay control signal and prepare for a next potential shift through the steps 606 and 608.

Figure 7:
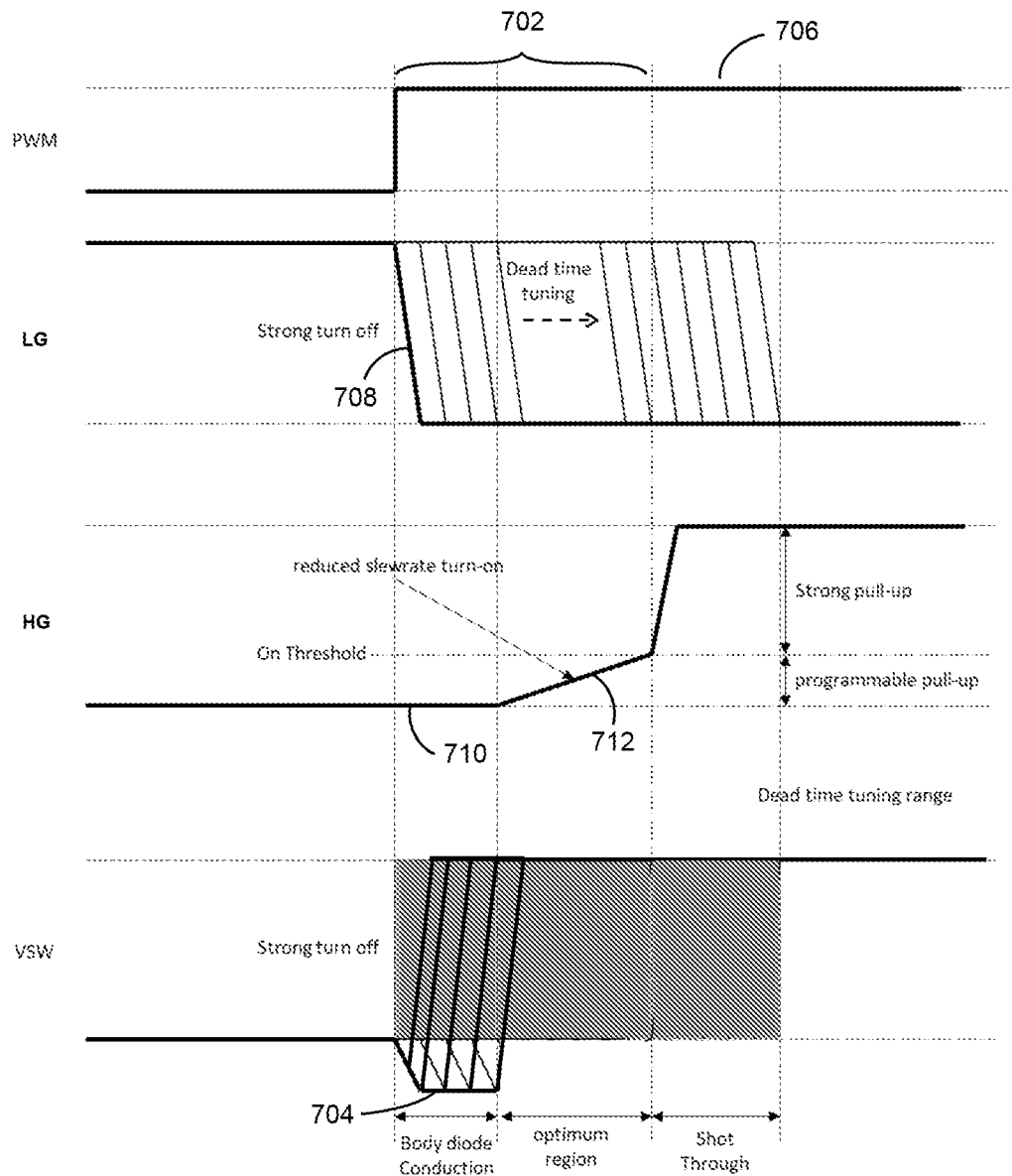
FIG. 7 shows wave diagrams of the input signal, the output signal, and control signals to the switches according to an embodiment.

Referring to FIG. 7, at a rising edge of the PWM signal at a start of the fourth period 702, there occurs the reverse recovery current in the LS 204 due to the control signal LG applied thereon turns low from a high level as indicated by reference label 708. After the measurement of the negative voltage 704, the control signal HG applied to the HS 202 is delayed by the delay control signal ON_DELAY_CTRL for a period, as depicted by label 710, before the control signal HG starts to be pulled up in subsequent periods 712 and 706. The control signal HG is pulled up towards a turn-on threshold voltage of the HS 202 during the period 712, therefore the HS 202 is not yet on during the period 712. During the period 706 after the control signal HG reaches the turn-on threshold voltage of the HS 202, the HS 202 is switched on by the pulled-up high level control signal HG, resulting in a high half-bridge voltage VSW.

Returning back to FIG. 2, during a rising phase of the half-bridge voltage SW, if the HS 202 is controlled to become "on" earlier by reducing a delay time from the current delay time for which the HS 202 is switched on, it can also be implemented to add a delay time to switch off the LS 204 during such rising phase of the half-bridge voltage SW when it is measured to be too low below the lower limit voltage. Similarly, if the HS 202 is controlled to become "on" later by adding a delay time into the current delay time in switching the HS 202 on when the half-bridge voltage SW is measured to be higher than the higher limit voltage, it can also be implemented to reduce a delay time to switch off the LS 204 during such rising phase of the half-bridge voltage SW.

Similar reverse recovery current may be generated when the control signal HG drops to a low level trying to turn off the HS 202. Similar to the method as shown in FIG. 6, the second measurement circuit 224 measures a voltage VSW of the half-bridge voltage SW in which there is a falling edge, and if necessary adjusts the delay time introduced into the control signal LG applying on the LS 204 for switching on the LS 204. Briefly, during a falling phase of the half-bridge voltage SW, if it is measured as too high above a second upper limit voltage, the LS 204 is controlled to be switched on by reducing a delay time from a current delay time, so that the LS 204 is switched on earlier to pull down the half-bridge voltage. Additionally, the HS 202 can be controlled to be switched off by adding a delay time into its current switch off delay time in response to the half-bridge voltage VSW being measured as higher than the second upper limit voltage during the falling phase. On the other hand, during such falling phase of the half-bridge voltage VSW, if it is measured to be lower than a second lower limit voltage, the LS 204 can be controlled to be switched on later by adding a delay time into the current LS switch on delay time, and/or the HS 202 can additionally be controlled to be off earlier by reducing a delay time from the current HS switch off delay time.

In one or more embodiments, the measurement of the half-bridge voltage SW can also be used in adjusting the time period the control signals HG or LG for the HS 202 or the LS 204 is pulled up in order to turn on the switches. Referring to FIG. 7, a gradient of the control signal HG during period 712 reflects a speed in which the control signal HG is pulled up before reaching the turn-on threshold voltage of the HS 202. The period 712 starts from the time spot when the delay time ends and the control signal is started to increase, until the control signal HG reaches a threshold voltage of the corresponding switch HS 202. The speed in which the control signals HG or LG is pulled up is also referred to as turn-on "slew rate" of the control signals HG/LG. A higher gradient in the control signal indicates a higher control signal slew rate.

Figure 8:
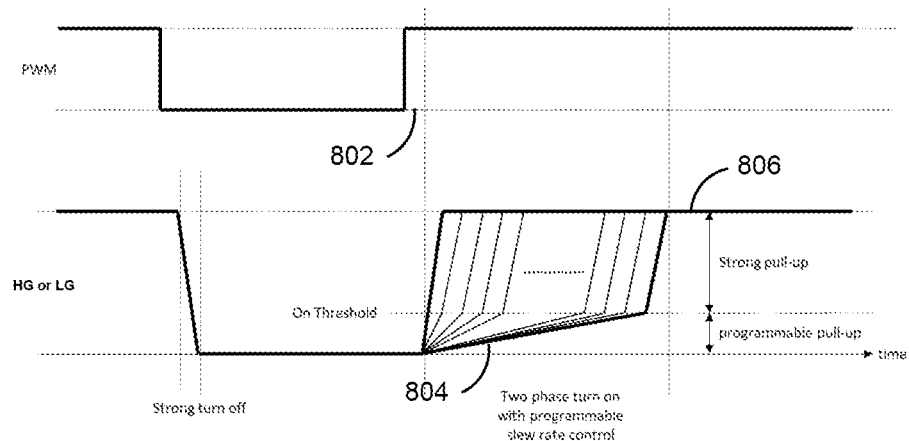
FIG. 8 shows wave diagrams of the input PWM signal and the control signal.

Referring to FIG. 8 which illustrates the signal form of the input PWM signal and the control signal HG or LG applied on the switches, during the delay time 802, the input PWM signal is already high while the control signal HG or LG is still delayed prior to being pulled up. As the delay time 802 lapses, the control signal HG or LG is pulled up to increase, and the speed of such increase is adjustable, as depicted by lines 804. At an end of such adjustable increase in the control signal HG or LG when a threshold voltage of the switch is reached, the control signal HG or LG is strongly pulled up to a turn-on voltage level 806, thereby switching on the HS 202 or the LS 204. As is known, the control signal HG or LG does not turn on the HS 202 or LS 204 until exceeding the threshold voltage of the switch, so the slew rate of the control signal also impacts the dead-time before the switch is on. It can be seen from FIG. 8 that a slower pull-up speed of the control signal HG/LG will prolong the dead-time during when both the high-side switch HS and the low-side switch LS are both off. However, considering that increasing the control signals too quickly may cause challenges to the switches HS/LS in responding to the control signals, the control signal slew rate of the embodiments is configurable while maintaining reliable switch responses.

Figure 9:
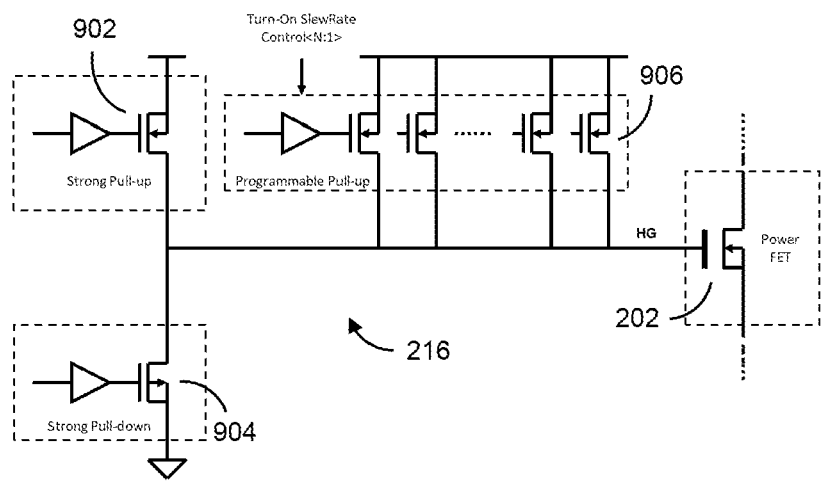
FIG. 9 is a schematic diagram of the driver circuit according to an embodiment.

Referring back to FIG. 2 and FIG. 3, the control signal slew rate can also be adjusted basing on the status signal from the measurement circuit 222 or 224. The first controller 226 and the second controller 228 generate slew-rate control signals basing on the status signals. FIG. 9 depicts a schematic diagram of an example implementation of the high-side driver 216 and the HS 202. The high-side driver 216 uses a slew-rate control signal from the controller circuit 210 to adjust the voltage of the gate control signal HG applied on the gate terminal of the HS 202. The high-side driver 216 includes a first switch 902 connected between a fully pull-up voltage and the control terminal of the HS 202, and a second switch 904 connected between the control terminal of the HS 202 and ground. The first switch 902 is controllably conductive to pull the control signal HG applied on the HS 202 rapidly to the fully pull-up voltage, to fully turn on the HS 202. The second switch 904 is controllably conductive to pull the control signal HG applied on the HS 202 rapidly to ground, to turn off the HS 202.

The high-side driver 216 of FIG. 9 further includes multiple adjusting switches 906. Each of the adjusting switches 906 receives one bit in a slew-rate control signal, for example generated by the first controller 226 as described above. The adjusting switches 906, when becoming on in response to the corresponding control bit in the slew-rate control signal, adds a value to the control signal HG to the HS 202, and in turn accelerates the control signal HG in increasing until the threshold voltage of the HS 202.

Referring back to FIG. 6, the slew-rate control signal can be generated by the first controller 226 in a similar way to that the delay time control signal DT_CTRL is generated, and is not explained in detail here. Generally, if the status signal shows that the voltage VSW of the half-bridge voltage SW is lower than the lower limit, as determined in step 608, it is desirable to pull up the control signal HG more quickly. Accordingly, step 610 of the method of FIG. 6 shifts the slew-rate control signal SR_CTRL a bit left, and adds to the rightmost bit of the slew-rate control signal SR_CTRL a "1" bit. With reference to FIG. 9, the step 610 thereby adds a value to the gate control signal HG, and is able to pull up the control signal HG faster. The step 614 of the method of FIG. 6, on the other hand, shifts the slew-rate control signal SR_CTRL a bit right, and set the leftmost bit of the slew-rate control signal SR_CTRL as bit "0", to reduce a value in the gate control signal HG, and reduces the speed in which the control signal HG is pulled up. A low-side driver having a structure similar as that shown in FIG. 9 can be implemented for the low-side switch 204.

Figure 10A:
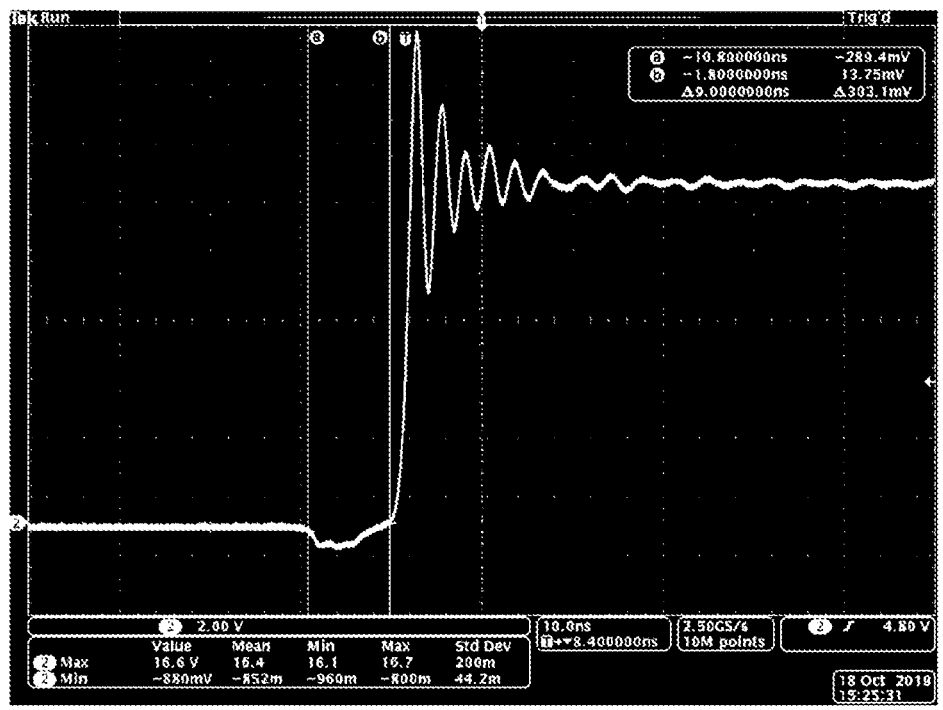
FIG. 10A is a wave diagram of the output signal without adjusting the delay time in the control signal.
Figure 10B:
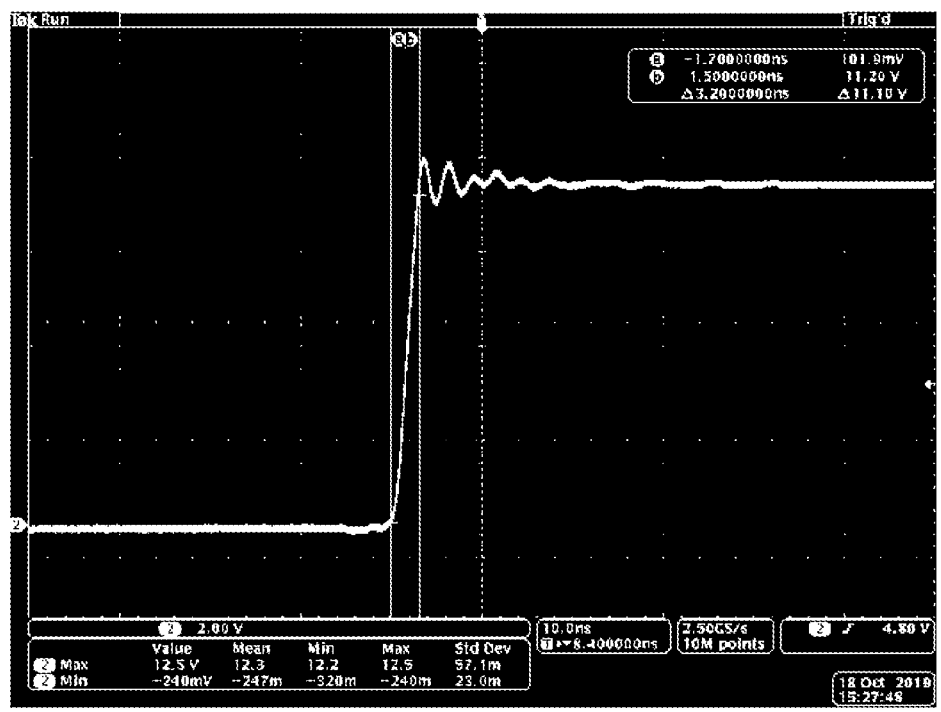
FIG. 10B is a wave diagram of the output signal with the delay time adjusted according to an embodiment.

Referring back to FIG. 3, the second measurement circuit 224 measures in the voltage VSW of the half-bridge voltage SW the falling edge, and generates a status signal VSW_FALL_STATUS indicative of the measured half-bridge voltage SW. Similar to that described with reference to the first controller 226 and the high-side switch 202, the falling edge status signal VSW_FALL_STATUS is used by the second controller 228 to introduce a delay into the control signals HG and LG to turn off the HS 202 and the LS 204, to eliminate excessively high voltages in the half-bridge voltage SW due to the reverse recovery current in the HS 202. FIG. 10A and FIG. 10B illustrate signal waveforms of the half-bridge voltage. FIG. 10A shows the half-bridge voltage without adjusting the delay to the control signals in switching the switches, in which a negative voltage below the low voltage level appears before the half-bridge voltage is pulled up by switching on the high-side switch, and the half-bridge voltage vibrates in a damping manner to the high voltage level after being pulled up. FIG. 10B shows the half-bridge voltage with the delay time to the control signals of the switches programmed and adjusted according to the detection of the body diode conduction in the switches by measuring the half-bridge voltage. In FIG. 10B the negative voltage below the low voltage level is eliminated greatly, and the half-bridge voltage after being pulled up is stabilized.

Figure 11:
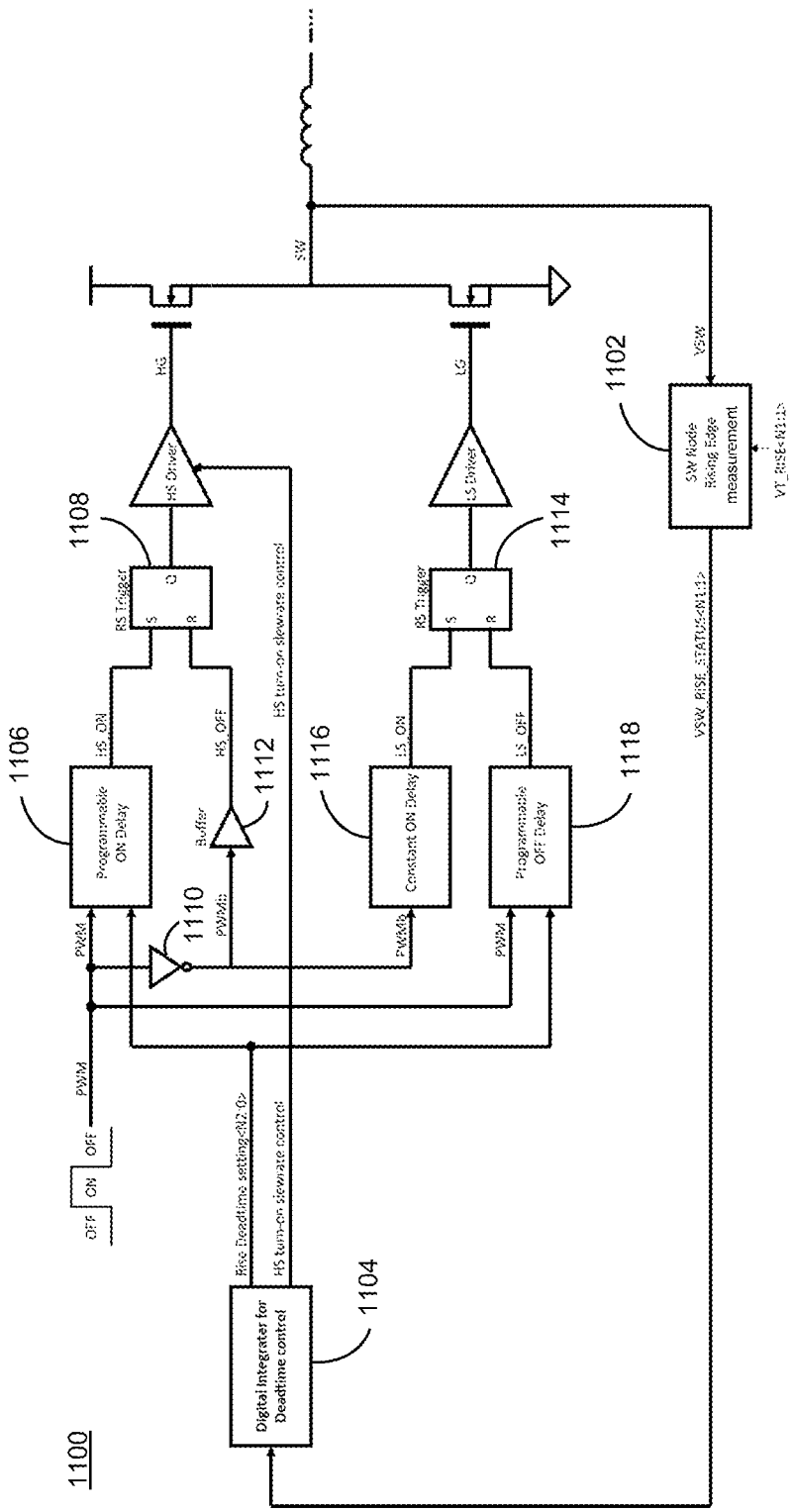
FIG. 11 is a block diagram of a half-bridge power circuit and a controller according to another embodiment.

FIG. 11 depicts a schematic diagram of a half-bridge power system according to another embodiment. The half-bridge power system 1100 is similar to the embodiment of FIG. 3. The half-bridge power system 1100 includes a measurement circuit 1102 which measures the half-bridge voltage in which there are rising edges, and generates a status signal VSW_RISE_STATUS indicative of the measurement, and a controller 1104 receiving the status signal and generates a delay control signal and optionally a slew-rate control signal. The controller 1104 provides the delay control signal to the high-side ON delay circuit 1106 which also receives the input PWM signal. The high-side ON delay circuit 1106 applies a delay to the PWM signal using the delay control signal from the controller 1104, and similar as the embodiment of FIG. 3 provides the high-side on signal HS_ON to the high-side trigger circuit 1108 to generate a high-side control signal to control the high-side switch. The high-side trigger circuit 1108 receives, on its resetting "R" terminal, a buffered inverted PWM signal as inverted by a high-side inverter 1110 and buffered by a high-side buffer circuit 1112, as a high-side OFF signal HS_OFF. Accordingly, the high-side switch is off when the PWM signal is in a low voltage.

On the low-side part of the embodiment of FIG. 11, the low-side trigger circuit 1114 receives, at a setting terminal "S" thereof, a low-side ON signal LS_ON which is an inverted revision of the PWM signal by the inverter 1110 after being applied a constant ON delay by the low-side ON delay circuit 1116. Accordingly the low-side switch is on after the PWM signal turns to the low voltage. The low-side trigger circuit 1110 also receives, at a resetting terminal "R" thereof, a low-side OFF signal LS_OFF which is adjustable/programmable by the low-side OFF delay circuit 1118 basing on the delay time control signal from the controller 1104 according to the status signal. The low-side OFF signal LS_OFF, when becoming a high state, resets an output signal of the low-side trigger circuit 1110, and accordingly switches off the low-side switch. The controller 1104 may operate in a flow similar to the embodiment of FIG. 6 to generate the delay control signals, to adjust the delay time before the switches are "on"/"off".

Figure 12:
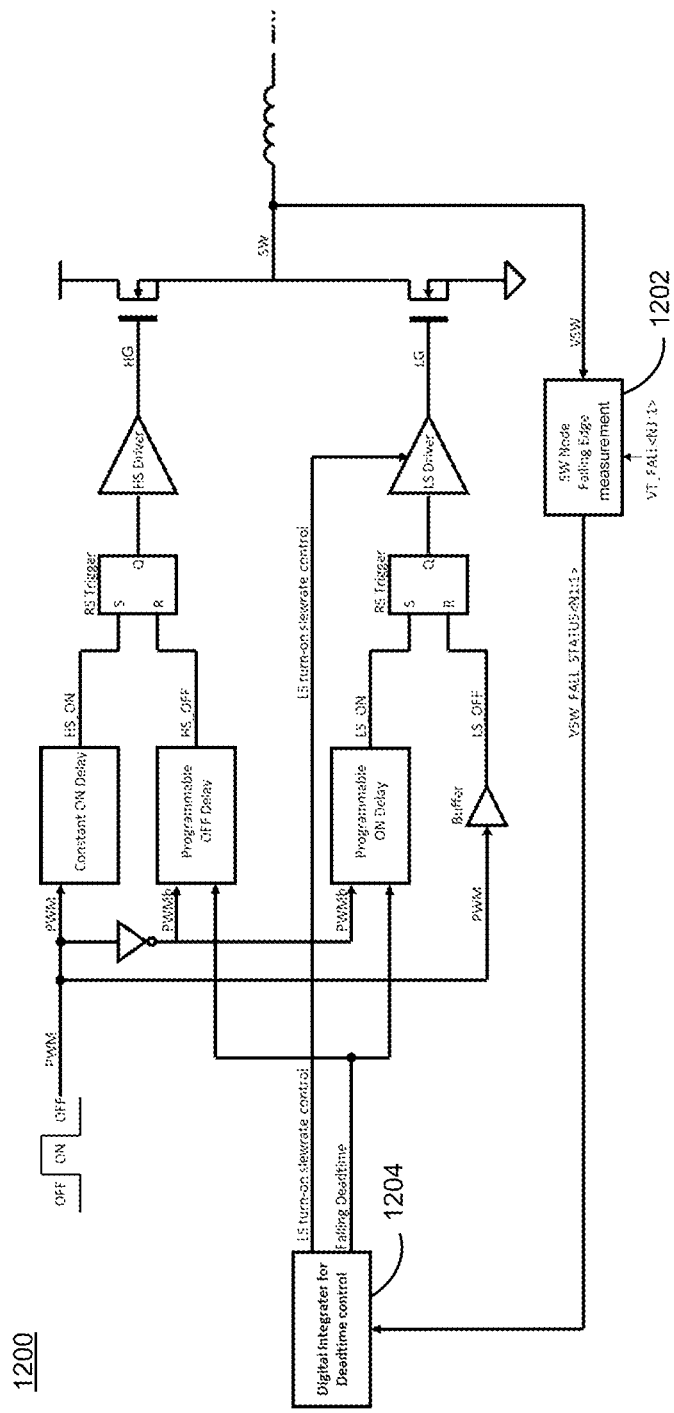
FIG. 12 is a block diagram of a half-bridge power circuit and a controller according to another embodiment.

FIG. 12 depicts another embodiment of the half-bridge power system. The half-bridge power system 1200 includes a measurement circuit 1202 for measuring the half-bridge voltage SW in which there is a falling edge, and generating a status signal VSW_FALL_STATUS indicative of the measurement. A controller 1204 of the half-bridge power system 1200 uses the status signal VSW_FALL_STATUS to adjust the delay time before the low-side switch is on, and the delay time before the high-side switch is off, as similar to that described with reference to FIG. 11.

The controllers and half-bridge power systems described measure the half-bridge voltage in which there is a rising/falling edge, to determine a body conduction status in the switches, and adjusts the time to start switching on/off the switches using the measurements. Besides, the measurements and the generated multi-bit status signals can further be used in adjusting the control signal slew rates in which the switches are switched on. The half-bridge power circuits become more efficient with the adjusted/programmable switch control delay time, and are efficient in reduced reverse recovery losses. Because the switches in the half-bridge power circuit are subject to process, voltage, and temperature (PVT) variations, the measurements and detections of behaviors of the switches and subsequent adjustments using the measurement enhance the robustness of the half-bridge power circuit against PVT variations.

The use of the terms "a" and "an" and "the" and similar referents in the context of describing the subject matter (particularly in the context of the following claims) are to be construed to cover both the singular and the plural, unless otherwise indicated herein or clearly contradicted by context. The terms "coupled" and "connected" both mean that there is an electrical connection between the elements being coupled or connected, and neither implies that there are no intervening elements. In describing transistors and connections thereto, the terms gate, drain and source are used interchangeably with the terms "gate terminal", "drain terminal" and "source terminal". Recitation of ranges of values herein are intended merely to serve as a shorthand method of referring individually to each separate value falling within the range, unless otherwise indicated herein, and each separate value is incorporated into the specification as if it were individually recited herein. Furthermore, the foregoing description is for the purpose of illustration only, and not for the purpose of limitation, as the scope of protection sought is defined by the claims set forth hereinafter together with any equivalents thereof entitled to. The use of any and all examples, or exemplary language (e.g., "such as") provided herein, is intended merely to better illustrate the subject matter and does not pose a limitation on the scope of the subject matter unless otherwise claimed. The use of the term "based on" and other like phrases indicating a condition for bringing about a result, both in the claims and in the written description, is not intended to foreclose any other conditions that bring about that result. No language in the specification should be construed as indicating any non-claimed element as essential to the practice of the disclosure as claimed.

Preferred embodiments are described herein, including the best mode known to the inventor for carrying out the claimed subject matter. Of course, variations of those preferred embodiments will become apparent to those of ordinary skill in the art upon reading the foregoing description. The inventor expects skilled artisans to employ such variations as appropriate, and the inventor intends for the claimed subject matter to be practiced otherwise than as specifically described herein. Accordingly, this claimed subject matter includes all modifications and equivalents of the subject matter recited in the claims appended hereto as permitted by applicable law. Moreover, any combination of the above-described elements in all possible variations thereof is encompassed unless otherwise indicated herein or otherwise clearly contradicted by context.

The invention claimed is:

1. A controller for a half-bridge power circuit comprising a high-side switch and a low-side switch, wherein the high-side switch and the low-side switch are series connected between a power supply and ground, and a half-bridge node between the high-side switch and the low-side switch provides a half-bridge voltage; wherein the controller comprises:
   a measurement circuit configured to be connected to the half-bridge node, wherein the measurement circuit is configured to measure the half-bridge voltage, and generate a multi-bit status signal indicative of the measured half-bridge voltage;

a controller circuit connected to the measurement circuit and configured to receive the status signal therefrom, wherein the controller circuit is configured to generate at least a delay control signal based on the status signal and generate a rise deadtime setting signal as the delay control signal in response to the status signal;

a high-side delay circuit connected to the controller circuit to receive the delay control signal, wherein the high-side delay circuit is configured to provide a high-side control signal in response to the delay control signal, to switch on/off the high-side switch, wherein the high-side delay circuit comprises:

a high-side ON delay circuit configured to receive the rise deadtime setting signal from the controller circuit, and generate a high-side ON signal as a response;

a high-side buffer circuit configured to receive an inverted version of a PWM signal, and generate a high-side OFF signal in response to the inverted version of the PWM signal; and a high-side trigger circuit connected to the high-side ON delay circuit and the high-side buffer circuit, and configured to generate the high-side control signal based on the high-side ON signal and the high-side OFF signal; and a low-side delay circuit connected to the controller circuit to receive the delay control signal, wherein the low-side delay circuit is configured to provide a low-side control signal in response to the delay control signal, to switch on/off the low-side switch.

2. The controller of claim 1, further comprising a high-side driver circuit connected to the high-side delay circuit to receive the high-side control signal, wherein the high-side driver circuit is configured to generate a high-side driver signal in response to the high-side control signal, and provide the high-side driver signal to control the high-side switch; and wherein the controller circuit is further configured to generate a high-side slew-rate control signal in response to the status signal; and the high-side driver circuit is further connected to the controller circuit to receive the high-side slew-rate control signal, and wherein the high-side driver signal is generated dependent on the high-side slew-rate control signal.

3. The controller of claim 1, wherein the low-side delay circuit comprises:

a low-side OFF delay circuit configured to receive the rise deadtime setting signal from the controller circuit, and generate a low-side OFF signal as a response;

a low-side ON delay circuit configured to receive the inverted version of the PWM signal, and generate a low-side ON signal in response to the inverted version of the PWM signal; and a low-side trigger circuit connected to the low-side OFF delay circuit and the low-side ON delay circuit, and configured to generate the low-side control signal based on the low-side OFF signal and the low-side ON signal;

wherein the controller further comprises a low-side driver circuit connected to the low-side delay circuit to receive the low-side control signal, wherein the low-side driver circuit is configured to generate a low-side driver signal in response to the low-side control signal, and provide the low-side driver signal to control the low-side switch.

4. The controller of claim 1, wherein the controller circuit is configured to generate a fall deadtime setting signal as the delay control signal in response to the status signal, and wherein the low-side delay circuit comprises:

a low-side ON delay circuit configured to receive the fall deadtime setting signal from the controller circuit, and generate a low-side ON signal as a response;

a low-side buffer circuit configured to receive a PWM signal, and generate a low-side OFF signal in response to the PWM signal; and a low-side trigger circuit connected to the low-side ON delay circuit and the low-side buffer circuit, and configured to generate the low-side control signal based on the low-side ON signal and the low-side OFF signal.

5. The controller of claim 4, further comprising a low-side driver circuit connected to the low-side delay circuit to receive the low-side control signal, wherein the low-side driver circuit is configured to generate a low-side driver signal in response to the low-side control signal, and provide the low-side driver signal to the low-side switch; and wherein the controller circuit is further configured to generate a low-side slew-rate control signal in response to the status signal; and the low-side driver circuit is further connected to the controller circuit to receive the low-side slew-rate control signal, and wherein the low-side driver signal is generated dependent on the low-side slew-rate control signal.

6. The controller of claim 4, wherein the high-side delay circuit comprises:

a high-side OFF delay circuit configured to receive the fall deadtime setting signal from the controller circuit, and generate a high-side OFF signal as a response;

a high-side ON delay circuit configured to receive the PWM signal, and generate a high-side ON signal in response to the PWM signal; and a high-side trigger circuit connected to the high-side OFF delay circuit and the high-side ON delay circuit, and configured to generate the high-side control signal based on the high-side OFF signal and the high-side ON signal;

and wherein the controller further comprises a high-side driver circuit connected to the high-side delay circuit to receive the high-side control signal, wherein the high-side driver circuit is configured to generate a high-side driver signal in response to the high-side control signal, and provide the high-side driver signal to the high-side switch.

7. The controller of claim 1, wherein the controller circuit is configured to generate a rise deadtime setting signal in response to a first status signal, and a fall deadtime setting signal in response to a second status signal, and wherein the high-side delay circuit comprises:

a high-side ON delay circuit configured to receive the fall deadtime setting signal from the controller circuit and a PWM signal, and generate a high-side ON signal as a response;

a high-side OFF delay circuit configured to receive the rise deadtime setting signal from the controller circuit and an inverted version of the PWM signal, and generate a high-side OFF signal as a response; and a high-side trigger circuit connected to the high-side ON delay circuit and the high-side OFF delay circuit, and configured to generate the high-side control signal based on the high-side ON signal and the high-side OFF signal.

8. The controller of claim 7, further comprising a high-side driver circuit connected to the high-side delay circuit to receive the high-side control signal; wherein
the controller circuit is further configured to generate a high-side slew-rate control signal in response to the status signal, and provide the high-side slew-rate control signal to the high-side driver circuit; and wherein
the high-side driver circuit is configured to generate a high-side driver signal dependent on the high-side control signal and the high-side slew-rate control signal, and provide the high-side driver signal to the high-side switch.

9. The controller of claim 1, wherein the controller circuit is configured to generate a rise deadtime setting signal in response to a first status signal, and a fall deadtime setting signal in response to a second status signal, and wherein the low-side delay circuit comprises:
a low-side ON delay circuit configured to receive the rise deadtime setting signal from the controller circuit and an inverted version of a PWM signal, and generate a low-side ON signal as a response;
a low-side OFF delay circuit configured to receive the fall deadtime setting signal from the controller circuit and the PWM signal, and generate a low-side OFF signal as a response; and
a low-side trigger circuit connected to the low-side ON delay circuit and the low-side OFF delay circuit, and configured to generate the low-side control signal based on the low-side ON signal and the low-side OFF signal.

10. The controller of claim 9, further comprising a low-side driver circuit connected to the low-side delay circuit to receive the low-side control signal; wherein
the controller circuit is further configured to generate a low-side slew-rate control signal in response to the status signal, and provide the low-side slew-rate control signal to the low-side driver circuit; and wherein
the low-side driver circuit is configured to generate a low-side driver signal dependent on the low-side control signal and the low-side slew-rate control signal, and provide the low-side driver signal to the low-side switch.

11. The controller of claim 1, wherein the high-side delay circuit is configured to provide the high-side control signal to apply a delay in switching on/off the high-side switch, and the low-side delay circuit is configured to provide the low-side control signal to apply a delay in switching on/off the low-side switch, wherein during a rising phase of the half-bridge voltage:
the high-side delay circuit is configured to provide the high-side control signal to
reduce a delay in switching on the high-side switch in response to the status signal indicating the half-bridge voltage is measured as lower than a first lower limit voltage; and
add a delay in switching on the high-side switch in response to the status signal indicating the half-bridge voltage is measured as higher than a first higher limit voltage;
and the low-side delay circuit is configured to provide the low-side control signal to
add a delay in switching off the low-side switch in response to the status signal indicating the half-bridge voltage is measured as lower than the first lower limit voltage; and
reduce a delay in switching off the low-side switch in response to the status signal indicating the half-bridge voltage is measured as lower than the first higher limit voltage.

12. The controller of claim 1, wherein the high-side delay circuit is configured to provide a high-side control signal to apply a delay in switching on/off the high-side switch, and the low-side delay circuit is configured to provide a low-side control signal to apply a delay in switching on/off the low-side switch, wherein during a falling phase of the half-bridge voltage:
the low-side delay circuit is configured to provide the low-side control signal to
reduce a delay in switching on the low-side switch in response to the status signal indicating the half-bridge voltage is measured as higher than a second higher limit voltage; and
add a delay in switching on the low-side switch in response to the status signal indicating the half-bridge voltage is measured as lower than a second lower limit voltage;
and the high-side delay circuit is configured to provide the high-side control signal to
add a delay in switching off the high-side switch in response to the status signal indicating the half-bridge voltage is measured as higher than the second higher limit voltage; and
reduce a delay in switching off the high-side switch in response to the status signal indicating the half-bridge voltage is measured as lower than the second lower limit voltage.

13. A method of operating a half-bridge power circuit, wherein the half-bridge power circuit comprises a high-side switch connected between a power supply and a half-bridge node, and a low-side switch connected between the high-side switch and ground; wherein the method comprises:
a measurement circuit connected to the half-bridge node and measuring a half-bridge voltage at the half-bridge node, and generating a multi-bit status signal indicative of the measured half-bridge voltage, wherein generating a multi-bit status signal comprises:
the measurement circuit comparing the half-bridge voltage with a first reference voltage, and generating a first bit of the status signal indicative of whether the half-bridge voltage is higher than the first reference voltage;
the measurement circuit comparing the half-bridge voltage with at least a second reference voltage, and generating a second bit of the status signal indicative of whether the half-bridge voltage is higher than the second reference voltage; and
the measurement circuit providing the first bit and at least the second bit as the status signal;
a controller circuit connected to the measurement circuit and generating at least a delay control signal based on the status signal;
a high-side delay circuit connected to the controller circuit and generating a high-side control signal using the delay control signal, wherein the high-side switch is switched on/off depending on the high-side control signal;
a low-side delay circuit connected to the controller circuit and generating a low-side control signal using the delay control signal, wherein the low-side switch is switched on/off depending on the low-side control signal; and
the half-bridge node providing the half-bridge voltage of the half-bridge power circuit.

14. The method of claim 13, further comprising:
during a rising phase of the half-bridge voltage, the controller circuit comparing a value of the multi-bit status signal with a first lower limit value corresponding to a first lower limit voltage, to determine whether the half-bridge voltage is lower than the first lower limit voltage; and
the high-side delay circuit generating the high-side control signal using the delay control signal to reduce a predetermined delay time from a current first delay time in response to the half-bridge voltage being lower than the first lower limit voltage;
wherein the method further comprises: the high-side switch being on in response to the high-side control signal by applying the first delay time;
and wherein the method further comprises:
during the rising phase of the half-bridge voltage, the low-side delay circuit generating the low-side control signal using the delay control signal to add a predetermined delay time into a current second delay time in response to the half-bridge voltage being lower than the first lower limit voltage; and
the low-side switch being off in response to the low-side control signal by applying the second delay time.

15. The method of claim 14, further comprising:
during the rising phase of the half-bridge voltage, the controller circuit comparing a value of the multi-bit status signal with a first upper limit value corresponding to a first upper limit voltage, to determine whether the half-bridge voltage is higher than the first upper limit voltage; and
the high-side delay circuit generating the high-side control signal using the delay control signal to add a predetermined delay time into the current first delay time in response to the half-bridge voltage being higher than the first upper limit voltage;
and wherein the method further comprises:
during the rising phase of the half-bridge voltage, the low-side delay circuit generating the low-side control signal using the delay control signal to reduce a predetermined delay time from a current second delay time in response to the half-bridge voltage being higher than the first upper limit voltage.

16. The method of claim 13, further comprising:
during a falling phase of the half-bridge voltage, the controller circuit comparing a value of the multi-bit status signal with a second higher limit value corresponding to a second upper limit voltage, to determine whether the half-bridge voltage is higher than the second upper limit voltage; and
the low-side delay circuit generating the low-side control signal using the delay control signal to reduce a predetermined delay time from a current third delay time in response to the half-bridge voltage being higher than the second upper limit voltage;
wherein the method further comprises: the low-side switch being on in response to the low-side control signal by applying the third delay time;
and wherein the method further comprises:
during the falling phase of the half-bridge voltage, the high-side delay circuit generating the high-side control signal using the delay control signal to add a predetermined delay time into a current fourth delay time in response to the half-bridge voltage being higher than the second upper limit voltage; and
the high-side switch being off in response to the high-side signal by applying the fourth delay time.

17. The method of claim 16, further comprising:
during the falling phase of the half-bridge voltage, the controller circuit comparing a value of the multi-bit status signal with a second lower limit value corresponding to a second lower limit voltage, to determine whether the half-bridge voltage is lower than the second lower limit voltage; and
the low-side delay circuit generating the low-side control signal using the delay control signal to add a predetermined delay time into the current third delay time in response to the half-bridge voltage being lower than the second lower limit voltage;
and wherein the method further comprises:
during the falling phase of the half-bridge phase, the high-side delay circuit generating the high-side control signal using the delay control signal to reduce a predetermined delay time from a current fourth delay time in response to the half-bridge voltage being lower than the second lower limit voltage.

18. The method of claim 13, further comprising:
the controller circuit generating, in response to the status signal, a high-side slew-rate control signal and a low-side slew-rate control signal;
the controller circuit providing the high-side slew-rate control signal to a high-side driver circuit;
the controller circuit providing the low-side slew-rate control signal to a low-side driver circuit;
the high-side driver circuit generating a high-side driver signal dependent on the high-side control signal and the high-side slew-rate control signal, and driving the high-side switch using the high-side driver signal; and
the low-side driver circuit generating a low-side driver signal dependent on the low-side control signal and the low-side slew rate control signal, and driving the low-side switch using the low-side driver signal.

19. A controller for a half-bridge power circuit comprising a high-side switch and a low-side switch, wherein the high-side switch and the low-side switch are series connected between a power supply and ground, and a half-bridge node between the high-side switch and the low-side switch provides a half-bridge voltage; wherein the controller comprises:
a measurement circuit configured to be connected to the half-bridge node, wherein the measurement circuit is configured to measure the half-bridge voltage, and generate a multi-bit status signal indicative of the measured half-bridge voltage;
a controller circuit connected to the measurement circuit and configured to receive the status signal therefrom, wherein the controller circuit is configured to generate at least a delay control signal based on the status signal and generate a fall deadtime setting signal as the delay control signal in response to the status signal;
a high-side delay circuit connected to the controller circuit to receive the delay control signal, wherein the high-side delay circuit is configured to provide a high-side control signal in response to the delay control signal, to switch on/off the high-side switch; and
a low-side delay circuit connected to the controller circuit to receive the delay control signal, wherein the low-side delay circuit is configured to provide a low-side control signal in response to the delay control signal, to switch on/off the low-side switch, wherein the low-side delay circuit comprises:

a low-side ON delay circuit configured to receive the fall deadtime setting signal from the controller circuit, and generate a low-side ON signal as a response;

a low-side buffer circuit configured to receive a PWM signal, and generate a low-side OFF signal in response to the PWM signal; and a low-side trigger circuit connected to the low-side ON delay circuit and the low-side buffer circuit, and configured to generate the low-side control signal based on the low-side ON signal and the low-side OFF signal.

20. A controller for a half-bridge power circuit comprising a high-side switch and a low-side switch, wherein the high-side switch and the low-side switch are series connected between a power supply and ground, and a half-bridge node between the high-side switch and the low-side switch provides a half-bridge voltage; wherein the controller comprises:

a measurement circuit configured to be connected to the half-bridge node, wherein the measurement circuit is configured to measure the half-bridge voltage, and generate a multi-bit status signal indicative of the measured half-bridge voltage;

a controller circuit connected to the measurement circuit and configured to receive the status signal therefrom, wherein the controller circuit is configured to generate at least a delay control signal based on the status signal and generate a rise deadtime setting signal in response to a first status signal, and a fall deadtime setting signal in response to a second status signal;

a high-side delay circuit connected to the controller circuit to receive the delay control signal, wherein the high-side delay circuit is configured to provide a high-side control signal in response to the delay control signal, to switch on/off the high-side switch, wherein the high-side delay circuit comprises:

a high-side ON delay circuit configured to receive the fall deadtime setting signal from the controller circuit and a PWM signal, and generate a high-side ON signal as a response;

a high-side OFF delay circuit configured to receive the rise deadtime setting signal from the controller circuit and an inverted version of the PWM signal, and generate a high-side OFF signal as a response; and a high-side trigger circuit connected to the high-side ON delay circuit and the high-side OFF delay circuit, and configured to generate the high-side control signal based on the high-side ON signal and the high-side OFF signal; and a low-side delay circuit connected to the controller circuit to receive the delay control signal, wherein the low-side delay circuit is configured to provide a low-side control signal in response to the delay control signal, to switch on/off the low-side switch.

* * * * *